(12) United States Patent
Lee et al.

(10) Patent No.: US 10,297,403 B2
(45) Date of Patent: May 21, 2019

(54) METHOD FOR MANUFACTURING LIGHTING BUTTON KEY

(71) Applicants: Hyundai Motor Company, Seoul (KR); Kia Motors Corporation, Seoul (KR); Daesung Electric Co., Ltd., Ansan, Gyeonggi-do (KR)

(72) Inventors: Young Ju Lee, Gyeonggi-do (KR); Chang Hyeon Noh, Gyeonggi-do (KR); Hye Kyung Kim, Gyeonggi-do (KR); Dae Ig Jung, Gyeonggi-do (KR); Keon Soo Jin, Ulsan (KR); Hak Soo Kim, Gyeonggi-do (KR); Won Jo Joo, Gyeonggi-do (KR)

(73) Assignees: Hyundai Motor Company, Seoul (KR); Kia Motors Corporation, Seoul (KR); Daesung Electric Co., Ltd., Ansan, Gyeonggi-do (KR)

( * ) Notice: Subject to any disclaimer, the term of this patent is extended or adjusted under 35 U.S.C. 154(b) by 250 days.

(21) Appl. No.: 15/331,756

(22) Filed: Oct. 21, 2016

(65) Prior Publication Data

US 2017/0330703 A1 Nov. 16, 2017

(30) Foreign Application Priority Data

May 11, 2016 (KR) .................. 10-2016-0057305

(51) Int. Cl.
| | | |
|---|---|---|
| G03F 7/16 | (2006.01) |
| H01H 11/00 | (2006.01) |
| B21D 22/02 | (2006.01) |
| B29C 45/14 | (2006.01) |
| G03F 7/20 | (2006.01) |
| G03F 7/26 | (2006.01) |
| H01H 13/02 | (2006.01) |
| H01H 13/14 | (2006.01) |
| B29K 667/00 | (2006.01) |
| B29K 705/00 | (2006.01) |
| B29L 19/00 | (2006.01) |

(52) U.S. Cl.
CPC ............ *H01H 11/00* (2013.01); *B21D 22/02* (2013.01); *B29C 45/14336* (2013.01); *B29C 45/14827* (2013.01); *G03F 7/16* (2013.01); *G03F 7/2002* (2013.01); *G03F 7/26* (2013.01); *H01H 13/023* (2013.01); *H01H 13/14* (2013.01); *B29C 2045/14237* (2013.01); *B29K 2667/003* (2013.01); *B29K 2705/00* (2013.01); *B29K 2995/0026* (2013.01); *B29K 2995/0029* (2013.01); *B29L 2019/00* (2013.01); *H01H 2229/016* (2013.01); *H01H 2229/044* (2013.01)

(58) Field of Classification Search
CPC .......... G03F 7/161; G03F 7/2002; G03F 7/26; H01H 2229/044; H01H 2229/016; B29C 2045/14237; B29K 2995/0026
USPC ........................................................ 430/314
See application file for complete search history.

(56) References Cited

U.S. PATENT DOCUMENTS

2010/0294654 A1* 11/2010 Park .................. C25D 1/10
204/281

FOREIGN PATENT DOCUMENTS

| JP | 2008-052966 A | 3/2008 |
| KR | 2006-0033076 A | 4/2006 |
| KR | 2007-0037767 A | 4/2007 |
| KR | 10-2008-0064116 A | 7/2008 |
| KR | 2013-0141959 A | 12/2013 |
| KR | 10-2015-0143390 A | 12/2015 |

* cited by examiner

*Primary Examiner* — Daborah Chacko-Davis
(74) *Attorney, Agent, or Firm* — Mintz Levin Cohn Ferris Glovsky and Popeo, P.C.; Peter F. Corless

(57) ABSTRACT

A method for manufacturing a lighting button key is provided. The method includes forming a button body by processing a metal plate, attaching a thin film to the button body and performing double etching on a rear surface of the button body to process a symbol pattern. Additionally, the method includes press-forming the rear surface of the button body and an injection material of a transparent or translucent material into the rear surface of the button body to perform injection molding.

5 Claims, 4 Drawing Sheets

METHOD FOR MANUFACTURING LIGHTING BUTTON KEY

CROSS-REFERENCE TO RELATED APPLICATION

This application claims under 35 U.S.C. § 119(a) the benefit of priority to Korean Patent Application No. 10-2016-0057305 filed on May 11, 2016, the entire contents of which are incorporated herein by reference.

BACKGROUND (a) Field of Invention

The present disclosure relates to a method for manufacturing a lighting button key, and more particularly, to a method for manufacturing a lighting button key that reduces process time and manufacturing costs by simplifying a manufacturing process.

(b) Description of the Related Art

Generally, a button key is used for portable terminals or electronic devices installed within a vehicle. In particular, the button key is classified into a film insert type and a mold type as determined by a manufacturing method. For example, the film insert type button key is integrally manufactured with transparent plastic by printing a letter component and a backlighting component on a thin film of plastic that forms the film in a button shape and intersects the film into an injection mold.

Further, the mold type button key is manufactured by injection molding a transparent plastic button, painting a button, laser marking a portion where letters are displayed and making the component transparent and a ultraviolet (UV) coating is applied to a surface of the button. However, the film insert type button key has a film portion that may be stripped after extended use and the film and a plastic injection portion may be separated when exposed to a thermal shock. In particular, a texture of the button key may be compromised. Further, the mold type button key has a reduced reliability of wear resistance, a texture of metal may not be expressed to limit texture expression and a post-processing technology applicable to metal may not be applied.

Additionally, the related art reduces a thickness of a symbol part for a metal material by an etching process, forms the symbol part in required shape by a forming process and applies a bond solution. Then an injection process is performed to improve adhesion between metal and a film upon a bonding process. Next, a hairline processing process is performed and a CNC cutting process is used to determine the symbol shape. A coating process is simultaneously performed with supplementing a depth generated at milling processing as described above, thereby completing a product. Particularly, when the product is completed by the foregoing processes, costs increase due to the complex bonding and milling processes and the manufacturing time is also increased.

The above information disclosed in this section is merely for enhancement of understanding of the background of the invention and therefore it may contain information that does not form the prior art that is already known in this country to a person of ordinary skill in the art.

SUMMARY

The present invention provides a method for manufacturing a lighting button key manufactured without the existing bonding and CNC milling processes. In particular, the button key may be manufactured by performing primary etching on a bonded portion between a button body of a metal material and a film and then performing secondary etching for processing a symbol pattern at the same position to reduce the cost and complexity of a manufacturing process.

In one aspect, the present invention provides a method for manufacturing a lighting button key that may include forming a button body by processing a metal plate, attaching a thin film to the button body and performing double etching on a rear surface of the button body to process a symbol pattern, press forming the rear surface of the button body and injecting an injection material of a transparent or translucent material into the rear surface of the button body to perform an injection molding operation. In an exemplary embodiment, the double etching processing may include bonding between the button body and the thin film to perform primary etching and performing secondary etching to process the symbol pattern on the primarily etched button body.

In another exemplary embodiment, the shape processing may include applying a primary photo resist to the rear surface of the button body and then bonding a first photo mask film on which an etching pattern is printed. Then the primary photo resist may be formed having the etching pattern on the button body by irradiating ultraviolet rays to the first photo mask film and then the first photo mask film may be removed. Next, the button body may be primarily etched along the etching pattern and the primary photo resist may be removed from the button body.

In an exemplary embodiment, the double etching process may include applying a secondary photo resist to the button body and a second photo mask film having the symbol pattern bonded thereto. Then the secondary photo resist may be formed with the symbol pattern on the button body on which the etching pattern is formed by irradiating the ultraviolet rays to the second photo mask film and then removing the second photo mask film. Further, the button body may be secondarily etched along the symbol pattern and the secondary photo resist may be removed from the button body.

In another exemplary embodiment, etching may be performed to penetrate through the button body. In an exemplary embodiment, in the press forming step, the symbol pattern protruding from the rear surface of the button body may be press-formed by the double etching. In the injection molding process, the injection material may be injected into the press-formed symbol pattern when the thin film is attached.

BRIEF DESCRIPTION OF THE DRAWINGS

The above and other features of the present invention will now be described in detail with reference to exemplary embodiments thereof illustrated the accompanying drawings which are given hereinbelow by way of illustration only, and thus are not limitative of the present invention, and wherein.

Figure 1:
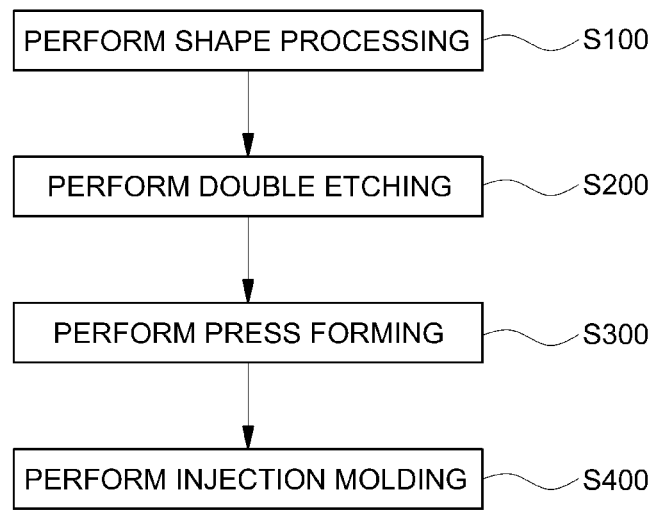
FIG. 1 is an exemplary flow chart sequentially illustrating a method for manufacturing a lighting button key according to an exemplary embodiment of the present invention.

It should be understood that the appended drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other exemplary embodiments, which may be included within the spirit and scope of the invention as defined by the appended claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Figure 2:
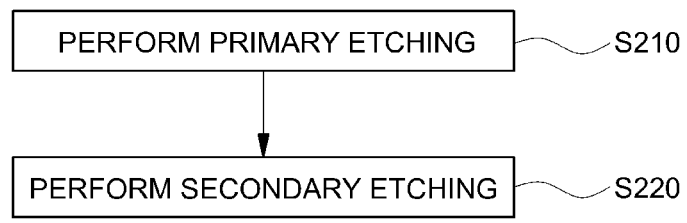
FIG. 2 is an exemplary flow chart sequentially illustrating a double etching processing performing step for the method for manufacturing a lighting button key according to the exemplary embodiment of the present invention.

FIG. 1 is an exemplary flow chart sequentially illustrating a method for manufacturing a lighting button key according to an exemplary embodiment of the present invention. FIG. 2 is an exemplary flow chart sequentially illustrating a double etching processing for the method for manufacturing a lighting button key according to the exemplary embodiment of the present invention. As illustrated in FIGS. 1 and 2, the method for manufacturing a lighting button key will be sequentially described below.

First, a button body may be formed by processing a metal plate (S100). Next, a thin polyethylene phthalate (PET) film may be coupled to the button body and double etching may be performed on a rear surface of the button body to process a symbol pattern (S200). In other words, instead of the existing method for manufacturing a lighting button key that performs bonding on an interior side of a button body of a metal material, then manufacturing a symbol using CNC cutting, and subsequently performs surface coating, according to the exemplary embodiment of the present invention, a thin PET film may be coupled to a surface of a button body and a double etching processing may be performed.

For example, according to the exemplary embodiment of the present invention, an etching pattern may be formed on a rear surface of the button body by performing primary etching on a bonded portion between the button body and the thin film (S210). The secondary etching for processing a symbol pattern may be performed on the primarily etched button body as described above (S220). Accordingly, the button key may be manufactured by performing the primary etching on the bond portion between the button body of the metal material and the film (S210). Then the secondary etching for processing the symbol pattern at the same position (S220) may be performed and the existing bonding and CNS milling processes may be eliminated from the manufacturing requirements.

Further, the rear surface of the button body may include the double etching process may be molded by pressing (S300) to process the symbol pattern. An injection material of a transparent or translucent material may be injected into the symbol pattern formed by the above process to perform injection molding. Finally, when the thin film is removed from the button body that preforms the press forming and the injection forming and the lighting button key becomes a completed product. Accordingly, the bonding and CNC milling process may be eliminated from the manufacturing process to reduce the required manufacturing process, process time and manufacturing costs.

In other words, when the existing CNC milling processing process is performed for processing the symbol pattern a thickness of the symbol pattern may not be uniform. Accordingly, a tool change may be required based on the thickness of the symbol pattern and a defective rate and a manufacturing cycle time may be increased. Therefore, according to the exemplary embodiment, the existing bonding and CNC milling processing processes may be removed and the symbol pattern may be formed on the button body by the double etching processing. In turn, the lighting button key may be more stably mass-produced.

Figure 3:
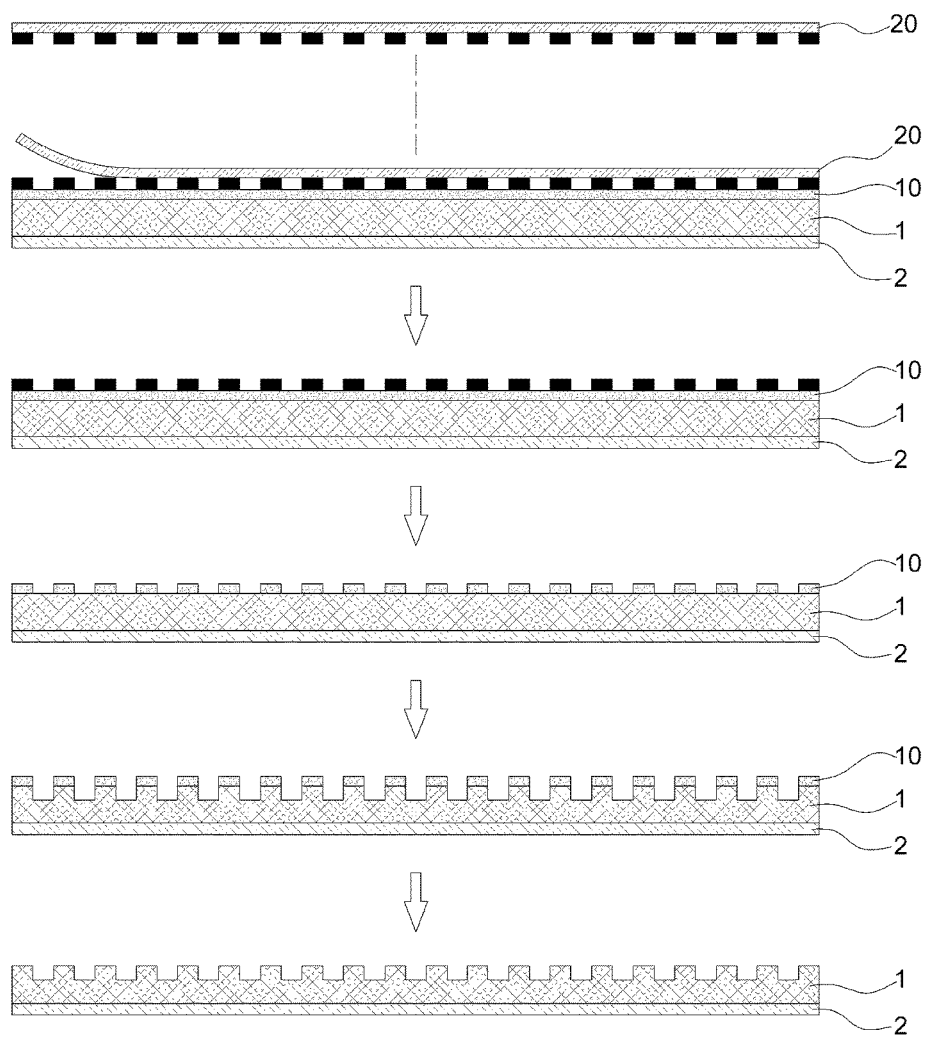
FIG. 3 is an exemplary diagram illustrating a primary etching process for the method for manufacturing a lighting button key according to the exemplary embodiment of the present invention.
Figure 4:
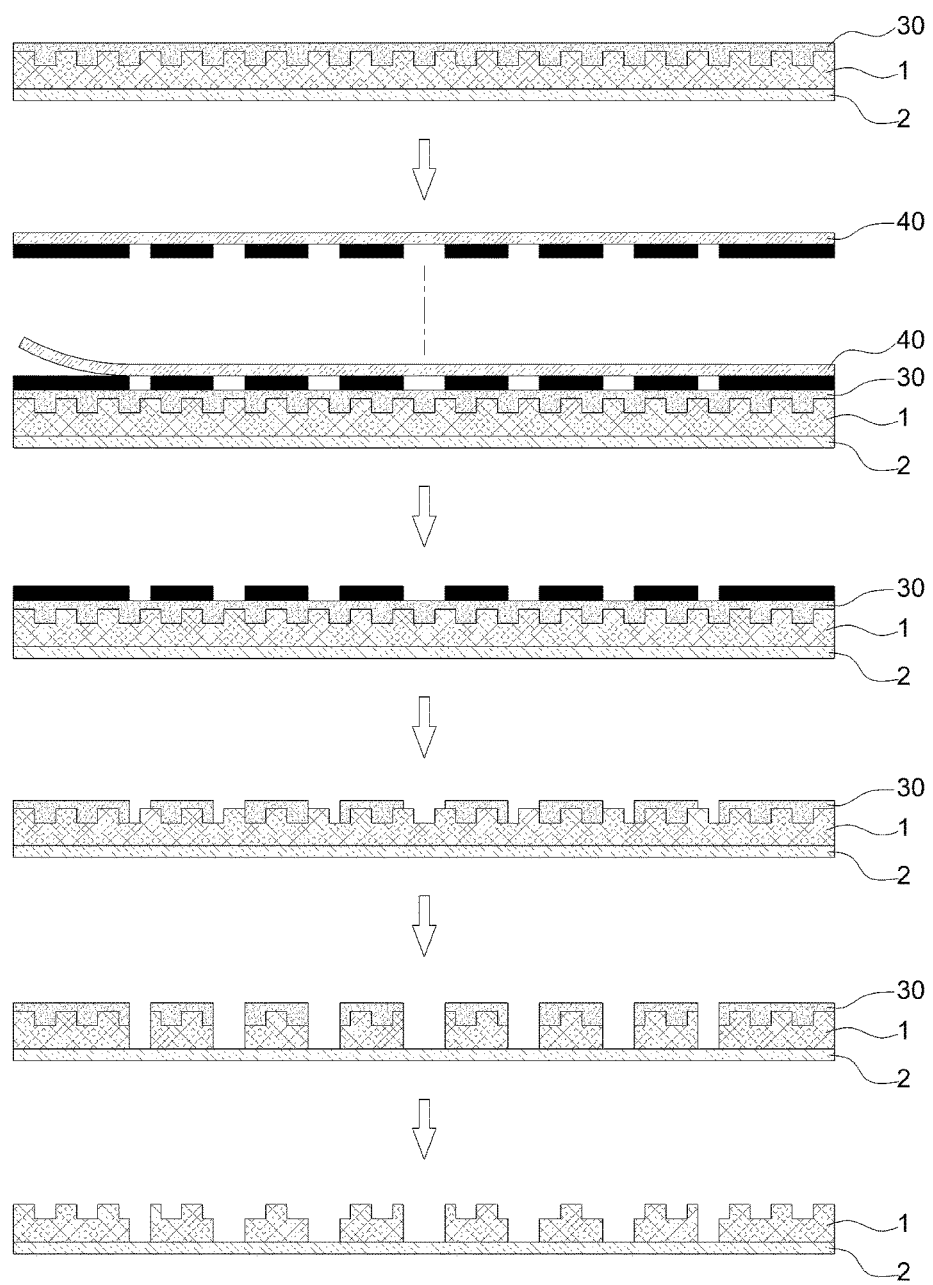
FIG. 4 is an exemplary diagram illustrating a secondary etching process for the method for manufacturing a lighting button key according to the exemplary embodiment of the present invention.

Hereinafter, FIG. 3 is an exemplary diagram illustrating a primary etching process for the method for manufacturing a lighting button key according to the exemplary embodiment of the present invention. FIG. 4 is an exemplary diagram illustrating a secondary etching process for the method for manufacturing a lighting button key according to the exemplary embodiment of the present invention. As illustrated in FIG. 3, in the double etching processing (S200) according to the exemplary embodiment of the present invention and the primary etching process (S210) will be first described as follows.

First, a primary photo resist 10 may be applied to the rear surface of the button body 1 when the thin PET film 2 and the button body 1 are sequentially disposed. Then a first photo mask film 20 that has an etching pattern printed thereon may be bonded to the button body 1. Next, the first photo mask film 20 may be irradiated with ultraviolet rays and may be removed to form the primary photo resist 10 having the etching pattern disposed on the button body 1.

For example, the primary photo resist 10 may be photosensitive paint. When the primary photo resist 10 is irradiated with the ultraviolet rays physical properties of the primary photo resist 10 may be altered or changed. According to the exemplary embodiment of the present invention, a polymer of a portion which may be attained when ultraviolet rays are solubilized may be used to remove the etching pattern simultaneously with removal of the primary photo resist 10. Accordingly, the primary photo resist 10 may include the etching pattern formed on the button body 1. As described above, after formation of the primary photo resist 10 with the etching pattern, the button body 1 may be etched to a depth of about 100 micron along the etching pattern to bond between the button body 1 and the thin film 2. In particular, the primary photo resist 10 may be removed from the button body 1 and the primary etching may be completed.

Further, as illustrated in FIG. 4, to perform the secondary etching (S220), a secondary photo resist 30 may be applied to the primarily etched button body 1 and then a second photo mask film 40 having a predetermined symbol pattern may be bonded thereto. In other words, the primary etching may be performed on the button body 1 and the secondary etching for processing the symbol pattern may be performed simultaneously. Then, the second photo mask film 40 may be irradiated with ultraviolet rays and may be removed to form the secondary photo resist 30 with the symbol pattern disposed on the button body 1 to form the etching pattern. In other words, similar to the performance of the primary etching, the secondary photo resist 30 may include a photosensitive paint and a polymer of a portion when the ultraviolet rays are solubilized to remove the symbol pattern simultaneously with removing the secondary photo resist 30. Accordingly, the secondary photo resist 30 with the symbol pattern formed on the button body with the etching pattern disposed thereon may be formed.

Next, the button body 1 may be etched along the symbol pattern. In other words, to perform the injection molding later, the secondary etching may be performed to penetrate through the button body 1. Finally, the secondary photo resist 30 may be removed from the button body 1 to complete the secondary etching. Accordingly, the button body 1 on which the predetermined symbol pattern is formed may be bonded to the thin film 2, to complete the lighting button key by the press forming (S300) and the injection molding (S400) that may be performed later.

Figure 5:
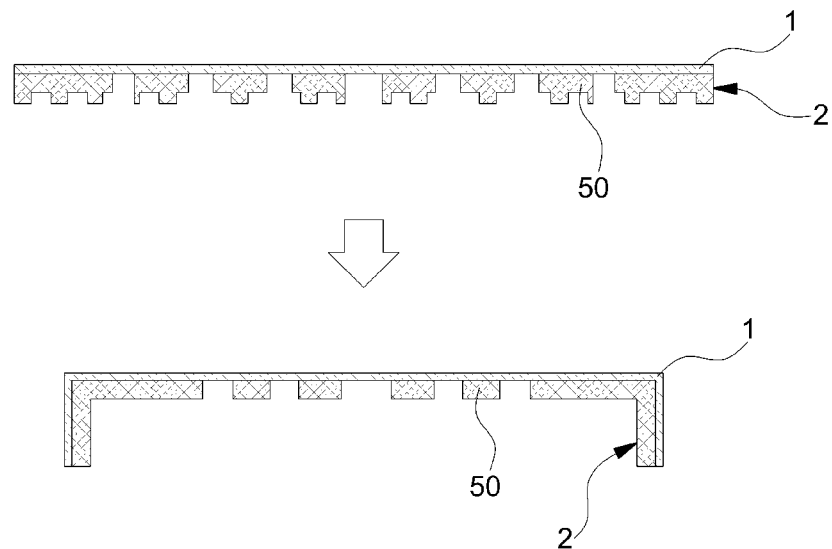
FIG. 5 is an exemplary diagram illustrating press forming for the method for manufacturing a lighting button key according to the exemplary embodiment of the present invention.
Figure 6:
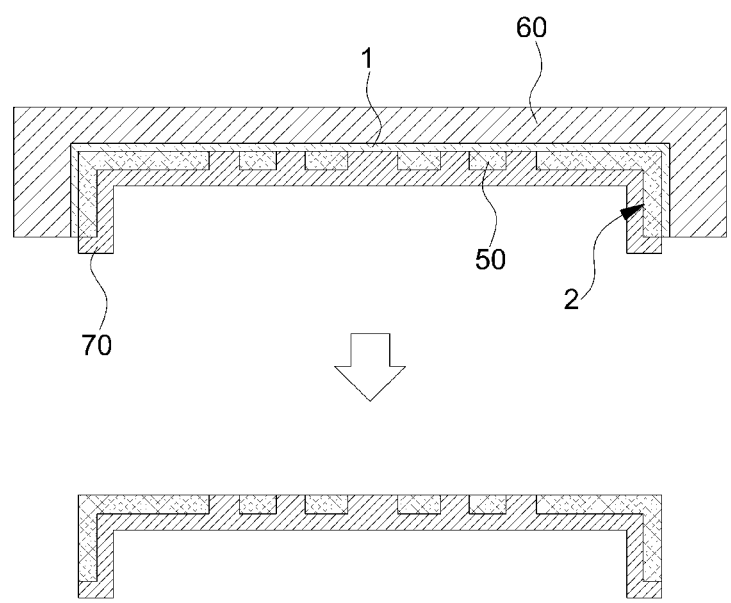
FIG. 6 is an exemplary diagram illustrating injection molding for the method for manufacturing a lighting button key according to the exemplary embodiment of the present invention.

Hereinafter, FIG. 5 is an exemplary diagram illustrating press forming for the method for manufacturing a lighting button key according to the exemplary embodiment of the present invention. FIG. 6 is an exemplary diagram illustrating injection molding for the method for manufacturing a lighting button key according to the exemplary embodiment of the present invention. As illustrated in FIG. 5, press forming (S300), may be performed when the double etching is performed on the button body 1 as described above and then islands 50 that may form the symbol pattern may be attached thereto.

Next, an injection material 70 of the transparent or translucent material may be injected into an area between the islands 50 that form the symbol pattern to injection mold the lighting button key (S400). For example, the button body 1 seated on an upper mold 60 of the pressing apparatus may be seated when the thin film 2 is attached. In particular, the injection material 70 may be prevented from being overmolded into the surface of the button body 1.

The thin film 2 attached to the surface of the button body 1 may be attached to enclose the island 50 that forms the symbol pattern and the remaining area as illustrated in FIG. 6. The injection material may be injected in the injection molding process (S400) and may be prevented from being over-molded into an exterior surface of the button body 1. Therefore, according to the exemplary embodiment of the present invention, a processing step related to the surface of the button body 1 is not required and therefore the separate coating process may be eliminated on the surface of the button body 1. In particular, when injection molding (S400) is performed without the separate coating process and then the thin film 2 is removed from the button body 1 the lighting button key product may be completed.

According to the exemplary embodiments of the present invention, the existing bonding and CNC milling processes may be performed by the primary etching on the bonded portion between the button body of the metal material and the film and the secondary etching that processes the symbol pattern at a similar position. Accordingly, the exemplary embodiments of the present invention may reduce the required manufacturing process, reduce the process time and the manufacturing costs.

The present invention is described with reference to the exemplary embodiment(s) illustrated in the drawings, which is only an example. Therefore, it will be understood that the present invention can be variously changed by those skilled in the art based on the exemplary embodiments and can be configured by the selective combination of all or some of the foregoing embodiment(s). Accordingly, the actual technical protection scope of the present invention must be determined by the spirit of the appended claims.

What is claimed is:

1. A method for manufacturing a lighting button key, comprising the steps of:
   providing a button body;

attaching a thin film to the button body and performing double etching on a rear surface of the button body to form a symbol pattern;

press-forming the rear surface of the button body by applying pressure so as to deform a shape of the button body; and injecting an injection material of a transparent or translucent material into the rear surface of the button body to perform an injection molding, wherein the step of performing double etching includes:

performing primary etching for forming an etched button body; and performing secondary etching for processing the symbol pattern on the primarily etched button body.

2. The method of claim 1, wherein the step of performing primary etching includes the steps of:

applying a primary photo resist to the rear surface of the button body and bonding a first photo mask film on which an etching pattern is printed onto the primary photo resist;

etching the button body along the etching pattern; and removing the primary photo resist from the button body.

3. The method of claim 2, wherein the step of performing secondary etching further includes the steps of:

applying a secondary photo resist to the button body and bonding a second photo mask film having a pattern for forming the symbol pattern thereto;

removing the second photo mask film by irradiating ultraviolet rays to the second photo mask film;

etching the etched button body along the pattern; and forming the symbol pattern by removing the secondary photo resist.

4. The method of claim 3, wherein the step of etching the etched button body further includes:

performing etching to penetrate through the etched button body.

5. The method of claim 1, wherein in the injection molding step, the injection material is injected into the symbol pattern such that the thin film is attached.

* * * * *